(12) United States Patent
Wassink et al.

(10) Patent No.: US 7,696,492 B2
(45) Date of Patent: Apr. 13, 2010

(54) RADIATION SYSTEM AND LITHOGRAPHIC APPARATUS

(75) Inventors: Arnoud Cornelis Wassink, Veldhoven (NL); Vadim Yevgenyevich Banine, Helmond (NL); Vladimir Vitalevitch Ivanov, Moscow (RU); Konstantin Nikolaevitch Koshelev, Troitsk (RU); Theodorus Petrus Maria Cadee, Vlierden (NL); Vladimir Mihailovitch Krivtsun, Troitsk (RU); Derk Jan Wilfred Klunder, Geldrop (NL); Maarten Marinus Johannes Wilhelmus Van Herpen, Heesch (NL); Paul Peter Anna Antonius Brom, Eindhoven (NL); Wouter Anthon Soer, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 488 days.

(21) Appl. No.: 11/637,936

(22) Filed: Dec. 13, 2006

(65) Prior Publication Data

US 2008/0142736 A1 Jun. 19, 2008

(51) Int. Cl.
*A61N 5/00* (2006.01)
*G21G 5/00* (2006.01)
(52) U.S. Cl. .............. 250/492.2; 250/504 R; 250/492.1; 250/505.1; 250/493.1; 250/503.1; 355/30; 355/67; 355/68; 378/34; 378/119
(58) Field of Classification Search ............ 250/504 R, 250/492.2, 492.1, 505.1, 493.1, 503.1; 355/30, 355/67, 68; 378/34, 119
See application file for complete search history.

(56) References Cited

U.S. PATENT DOCUMENTS 4,715,054 A 12/1987 Kato et al.

(Continued)

FOREIGN PATENT DOCUMENTS

EP 1 109 427 A2 6/2001

(Continued)

OTHER PUBLICATIONS

Antonsen, Erik et al., "Ion debris characterization from a z-pinch extreme ultraviolet light source,"Journal of Applied Physics, American Institute of Physics, New York, US, vol. 99, No. 6, 21, Mar. 21, 2006, pp. 63301-1-63301-8, XP012083962 ISSN: 0021-8979.

(Continued)

*Primary Examiner*—Jack I Berman
*Assistant Examiner*—Meenakshi S Sahu
(74) *Attorney, Agent, or Firm*—Pillsbury Winthrop Shaw Pittman, LLP (57) ABSTRACT

A radiation system for generating a beam of radiation that defines an optical axis is provided. The radiation system includes a plasma produced discharge source for generating EUV radiation. The discharge source includes a pair of electrodes constructed and arranged to be provided with a voltage difference, and a system for producing a plasma between the pair of electrodes so as to provide a discharge in the plasma between the electrodes. The radiation system also includes a debris catching shield for catching debris from the electrodes. The debris catching shield is constructed and arranged to shield the electrodes from a line of sight provided in a predetermined spherical angle relative the optical axis, and to provide an aperture to a central area between the electrodes in the line of sight.

35 Claims, 9 Drawing Sheets

U.S. PATENT DOCUMENTS

| | | |
|---|---|---|
| 6,998,785 B1 | 2/2006 | Silfvast et al. |
| 7,061,574 B2 * | 6/2006 | Bakker et al. .................. 355/30 |
| 2002/0090054 A1 | 7/2002 | Sogard |
| 2003/0071979 A1 | 4/2003 | Visser |
| 2005/0279946 A1 | 12/2005 | Rettig et al. |
| 2006/0011864 A1 | 1/2006 | Koshelev et al. ......... 250/492.2 |
| 2006/0012761 A1 | 1/2006 | Bakker et al. |
| 2006/0078089 A1 | 4/2006 | Masaki et al. |
| 2006/0261290 A1 | 11/2006 | Wilhelmus Van Herpen et al. |
| 2007/0125968 A1 | 6/2007 | Klunder et al. |
| 2007/0228303 A1 | 10/2007 | Fujimoto |

FOREIGN PATENT DOCUMENTS

| | | |
|---|---|---|
| EP | 1 491 963 A2 | 12/2004 |
| EP | 1 531 365 A1 | 5/2005 |
| EP | 1531365 * | 5/2005 |
| EP | 1 491 963 A3 | 8/2005 |
| EP | 1 742 110 A2 | 1/2007 |
| EP | 1 804 555 A1 | 7/2007 |
| EP | 1 804 556 A2 | 7/2007 |
| WO | WO 99/42904 | 8/1999 |
| WO | WO 2005/025280 A2 | 3/2005 |
| WO | WO 2005/101924 A1 | 10/2005 |

OTHER PUBLICATIONS

Written Opinion of the International Searching Authority for International Application No. PCT/NL2007/050598 dated Jun. 25, 2009.

* cited by examiner

RADIATION SYSTEM AND LITHOGRAPHIC APPARATUS

FIELD

The present invention relates to a radiation system and a lithographic apparatus that includes a radiation system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In addition to EUV radiation, radiation sources used in EUV lithography generate contaminant material that may be harmful for the optics and the working environment in which the lithographic process is carried out. Such is especially the case for EUV sources operating via a plasma produced discharge source, such as a plasma tin source. Such a source typically comprises a pair of electrodes to which a voltage difference can be applied. In addition, a vapor is produced, for example, by a laser beam that is targeted to, for example, one of the electrodes. Accordingly, a discharge will occur between the electrodes, generating a plasma, and which causes a so-called pinch in which EUV radiation is produced. In addition to this radiation, the discharge source typically produces debris particles, among which can be all kinds of microparticles varying in size from atomic to complex particles, which can be both charged and uncharged. It is desired to limit the contamination of the optical system that is arranged to condition the beams of radiation coming from an EUV source from this debris. Conventional shielding of the optical system primarily includes a system comprising a high number of closely packet foils aligned parallel to the direction of the light generated by the EUV source. A so-called foil trap, for instance, as disclosed in EP 1491963, uses a high number of closely packed foils aligned generally parallel to the direction of the light generated by the EUV source. Contaminant debris, such as micro-particles, nano-particles and ions can be trapped in walls provided by the foil plates. Thus, the foil trap functions as a contamination barrier trapping contaminant material from the source. Due to the arrangement of the platelets, the foil trap is transparent for light, but will capture debris either because it is not travelling parallel to the platelets, or because of a randomized motion caused by a buffer gas. It is desirable to improve the shielding of the radiation system, because some (directed, ballistic) particles may still transmit through the foil trap.

SUMMARY

According to an aspect of the invention there is provided a radiation system for generating a beam of radiation that defines an optical axis. The radiation system includes a plasma produced discharge source constructed and arranged to generate EUV radiation. The discharge source includes a pair of electrodes constructed and arranged to be provided with a voltage difference, and a system constructed and arranged to produce a discharge between the pair of electrodes so as to provide a pinch plasma between the electrodes. The radiation system also includes a debris catching shield constructed and arranged to catch debris from the electrodes, to shield the electrodes from a line of sight provided in a predetermined spherical angle relative the optical axis, and to provide an aperture to a central area between the electrodes in the line of sight.

According to an aspect of the invention, there is provided a lithographic apparatus that includes a radiation system for generating a beam of radiation that defines an optical axis. The radiation system includes a plasma produced discharge source constructed and arranged to generate EUV radiation. The discharge source includes a pair of electrodes constructed and arranged to be provided with a voltage difference, and a system constructed and arranged to produce a discharge between the pair of electrodes so as to provide a pinch plasma between the electrodes. The radiation system also includes a debris catching shield constructed and arranged to catch debris from the electrodes, to shield the electrodes from a line of sight provided in a predetermined spherical angle relative the optical axis, and to provide an aperture to a central area between the electrodes in the line of sight. The lithographic apparatus also includes a patterning device constructed and arranged to pattern the beam of radiation, and a projection system constructed and arranged to project the patterned beam of radiation onto a substrate.

Other aspects, features, and advantages of the present invention will become apparent from the following detailed description, the accompanying drawings, and the appended claims.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
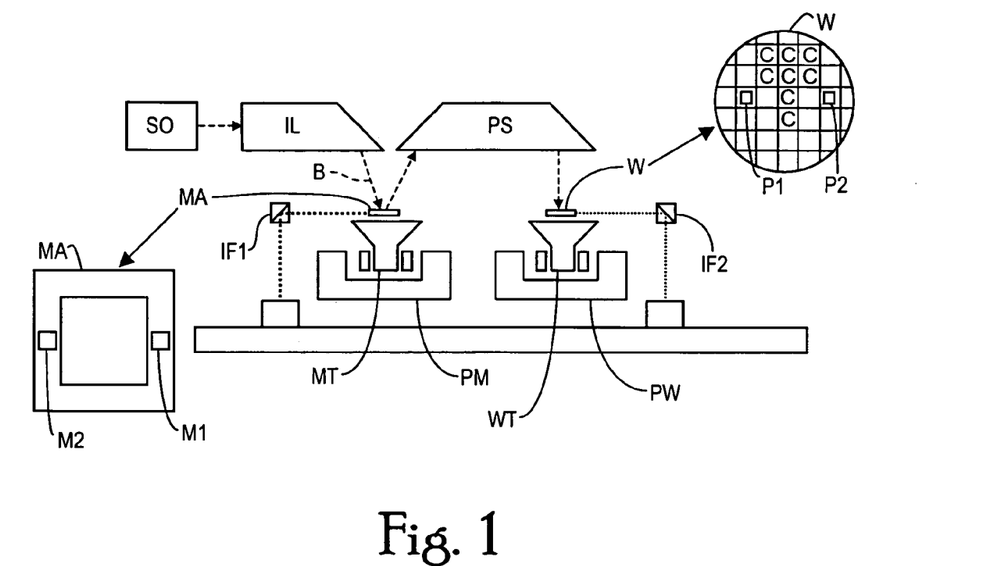
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination and projection systems may include various types of optical components, such as refractive, reflective, diffractive or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, or any combination thereof, as appropriate for the exposure radiation being used. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
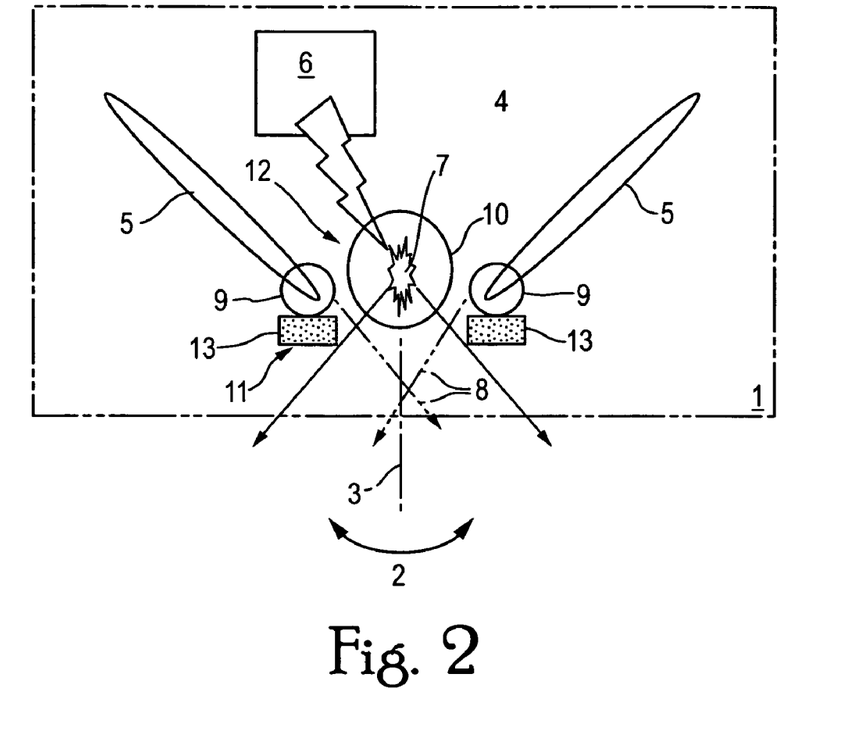
FIG. 2 depicts a schematic first embodiment of a radiation system of the lithographic apparatus of FIG. 1 according to an aspect of the invention.

In FIG. 2 a schematic first embodiment is shown of a radiation system according to an aspect of the invention. In particular, there is shown a radiation system 1 for generating a beam of radiation 2 defining an optical axis 3. The radiation system 1 includes a plasma produced discharge source 4 for generating EUV radiation. The discharge source includes a pair of electrodes 5 that are constructed and arranged to be provided with a voltage difference, and a system that typically includes a laser 6 for producing a vapor between the pair of electrodes so as to provide a discharge 7 between the electrodes 5. It has been found that debris 8 coming from the radiation system 1 is primarily produced on or near the electrodes 5. These effects also cause a generation of a so-called pinch which develops between the electrodes 5. Typically, the EUV light that is generated is produced by an electron transition in a Tin atom (or another suitable material, for example, Lithium or Xenon), which is ionized multiple times of electrons in the discharge process. It was found that debris particles 8, in particular, ballistic particles of the kind that may contaminate the downstream optics, are mainly produced on or near the electrodes 5 in debris producing zones 9, where the central EUV source light is mainly produced in the pinch zone 10 that is distanced from the debris producing zones 9. Thus, for a plasma produced discharge source 4, the debris producing zones 9 are typically distanced from the EUV radiation producing pinch zone 10. This effect can be utilized by the illustrated embodiment, which according to an aspect of the invention comprises a shield 11 to shield the electrodes 5 from a line of sight provided in a predetermined spherical angle relative the optical axis 3 and to provide an aperture 12 to a central area between the electrodes in the line of sight. Accordingly, debris 8, which is generated in the debris producing zone 9 initially (in the absence of additional electromagnetic fields, however, see the embodiment illustrated in FIG. 5-FIG. 7) travels substantially in straight lines from the zone 9. Thus, a shield 11 that shields the electrodes 5 from a line of sight in a predetermined spherical angle around the optical axis 3 is able to trap these debris particles 8, so that in the line of sight a substantial amount of debris 8 is prevented from entering downstream optics (not shown). Additionally, the shield 11 substantially does not shield the radiation coming from the EUV radiation producing pinch zone 10, since it provides an aperture 12 to a central area (conforming to a designated pinch zone 10) between the electrodes 5 in the line of sight, which accordingly can travel into the downstream optics substantially unhindered by the shield 11. In this way, the debris (which comes from the electrodes) may be stopped by the shield, without stopping the EUV radiation. Practically, it is convenient to shield both electrodes, since it is probable that both electrodes generate debris-producing zones that can attribute in debris 8 production.

The shielding effect can be further optimized by placing the shields 11 close enough, preferably, a distance ranging between 0.5 and 25 mm to any of the electrodes, to shield a maximum spherical angle of the debris producing zone 9.

To minimize a distance with the electrodes, the heat load will be so high on the shield 11 that it is preferably provided as a fluid jet 13, for example, of molten Tin. Such a jet could have a length of about 75 mm and a thickness of several mm, for example ranging from 0.5 to 3 mm. It is noted that fluid jets are per se known from U.S. 2006-0011864 which discloses electrodes in a plasma discharge source in the form of fluid jets, however, there is not disclosed a shield or at least one fluid jet provided near an electrode of a pair of electrodes. Accordingly, preferably, the debris catching shield 11 is provided, as illustrated, by a pair of fluid jets 13, arranged oppositely and generally parallel to a longitudinal axis of the electrodes 5. It may however, in certain embodiments, possible to direct the plasma production substantially towards one of the electrodes 5, which one electrode will accordingly be a major contributor in producing debris 8. Such debris may vary in size and travel speed. For instance, one can have micro-particles: these are micron-sized particles with relatively low velocities. In addition, there may be produced nano-particles, which are nanometer-sized particles with typically quite high velocities; atomic debris, which are individual atoms that act as gaseous particles; and ions, which are ionised high-velocity atoms.

It is noted that in one embodiment, the fluid jet 13 may be provided near an electrode of the pair of electrodes without substantially being configured to shield the electrodes from a line of sight provided in a predetermined spherical angle relative the optical axis and to provide an aperture to a central area 10 between the electrodes in the line of sight (unlike the embodiment shown in FIG. 2). In such an embodiment, according to another aspect of the invention, the fluid jet 13 may be accelerating the recombination rate of the plasma, which may increase the frequency of the EUV source 4 and accordingly may provide a higher power output of the radiation system. Specifically, the fluid jet 13 may comprise molten Tin, although other materials may be feasible to provide the same recombining effect, including, for example water or a liquid gas, such as liquid nitrogen or liquid argon. An advantage of the latter is that it may evaporate and thus may leave no further traces in the system. Additionally, the fluid is preferably of an electrically conductive material and may be kept at ground potential, although other materials, such as argon and nitrogen may also be used.

The advantage of the fluid jets is that the obstruction is continuously replaced and can thus withstand very high heat loads. However, in other embodiments, it may be possible, to provide a shield 11 that is positioned at generally the same distance nearby the electrodes 5 as discussed hereabove with reference to FIG. 2, but that is not formed by a fluid jet, but by a moving element (not shown), for example, an axially moving metal strip, that moves generally parallel to an electrode longitudinal axis, and which may be cooled by providing coolant in a container, for guiding the moving element there through.

Figure 3:
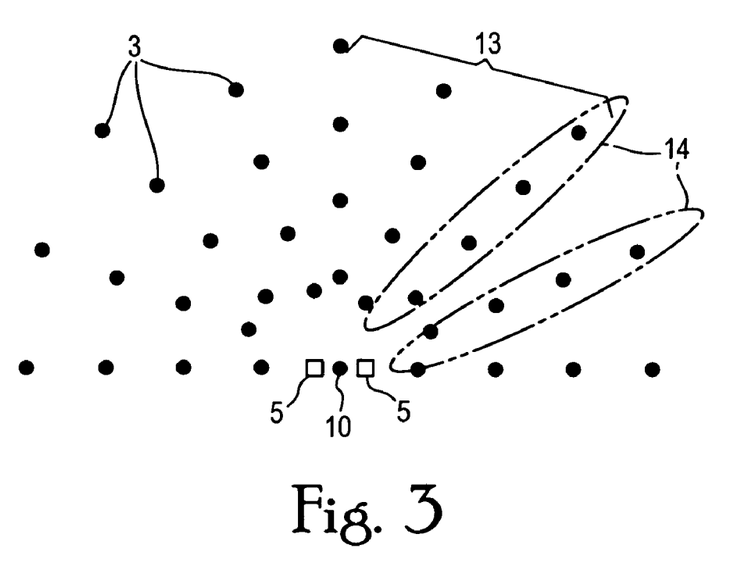
FIG. 3 shows schematically a second embodiment according to an aspect of the invention.

FIG. 3 shows schematically an embodiment of the invention, showing a shield in the form of a plurality of fluid jets 13, arranged in radial direction relative from the central area 10 between electrodes 5 in the line of sight. In such an embodiment, the fluid jets 13 are provided adjacent to each other, and may be generally aligned to form a static configuration of generally radially oriented platelets 14, relative to the central area 10. Although within the general context of the invention, preferably, these platelets are oriented to shield the electrodes 5 from a line of sight provided between the platelets 14, this embodiment may also have practical applications with the platelets oriented to include the electrodes 5 in a line of sight provided between the platelets 14. These applications may benefit from the heat load capacity of the shield 11 that is provided by the fluid jets 13. A further advantage is that the jets 13 by nature are not contaminated by debris depositions since they are continuously renewed. This is in contrast with a conventional foil trap solution where solid platelets 14 (foils) are used to provide shielding from debris 8. These conventional platelets therefore may suffer from contamination which may hinder a proper transmission of the EUV radiation.

Figure 4:
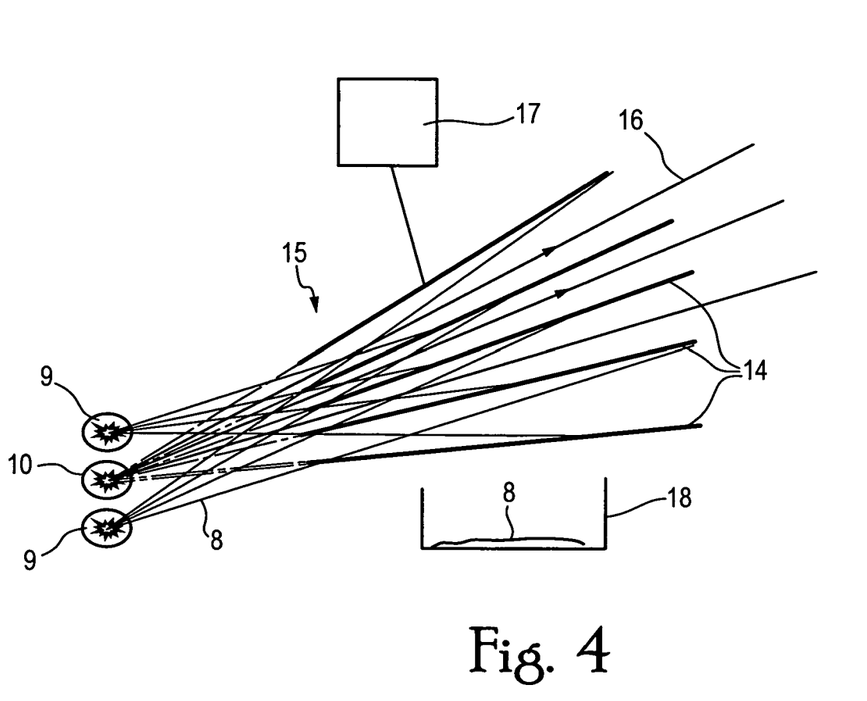
FIG. 4 shows a further embodiment according to an aspect of the invention.

In particular, especially for plasma produced discharge sources 4 operated with Tin plasma, a suitable material for the fluid jets may also be Tin or a compound comprising Tin, such as for example Ga—In—Sn, which may be suitable to have a lower melting point and easier handling properties. Furthermore, although FIG. 3 shows an embodiment wherein the jets 13 are dimensioned with a general circular form, other form, including strip forms may be feasible, thus providing a shield 11 comprising platelets 14 in the form of single jets, generally of the form as depicted in FIG. 4. A thickness of such liquid foil may be typically 0.5-1 mm, which is slightly thicker than conventional foil thicknesses that are about 0.1 mm thick. It is noted that thin liquid foils are discussed in T. Inamura, H. Tamura, H. Sakamoto, "Characteristics of Liquid Film and Spray Injected from swirl Coaxial Injector"; Journal of Propulsion and Power 19 (4), 623-639 (2003). In this publication, cone-shaped foils are produced. However, preferably, according to an aspect of the invention, a slit-shaped nozzle is used, in particular, for providing straight-formed jets that are radially oriented relative to a centre zone 10 wherein a pinch can develop. In addition, this static embodiment may be combined with a rotating foil trap, known per se from EP 1491963 and, of course, with other embodiments described in the current document.

Under certain circumstances, fluid jets may not be stable—i.e. they may spontaneously divide into droplets with a diameter approximately equal to the jet diameter. This means that it may only be possible to create continuous jets if the diameter is relatively large (>~0.5 mm). Therefore, it may be advantageous to use jets that intentionally consist of closely spaced droplets that can have a very small and controllable size, with a controllable distance between droplets. The ability to create such stable droplet chains (40 μm diameter with about 40 μm distance) was presented in the EUVL Sematech conference in Barcelona (Conference 7870, 17 Oct. 2006) by David Brandt (session 3-SO-04) for use as a laser target in a LPP EUV source.

Figure 13A:
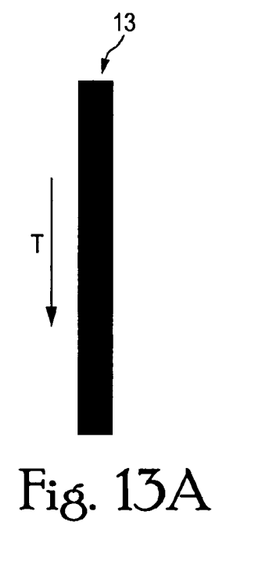
FIGS. 13a-e show embodiments of continuous and droplet fluid jets.
Figure 13B:
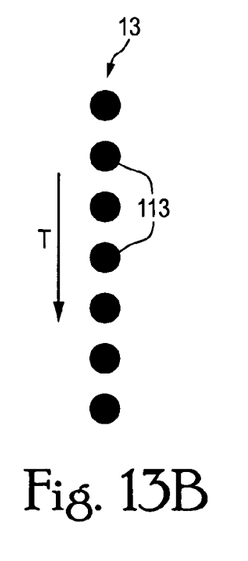
Figure 13C:
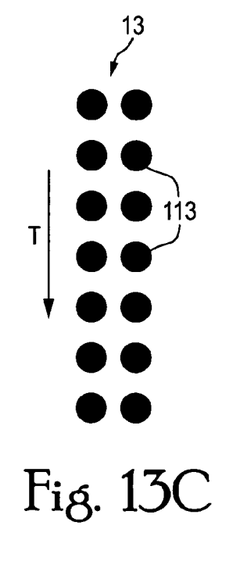
Figure 13D:
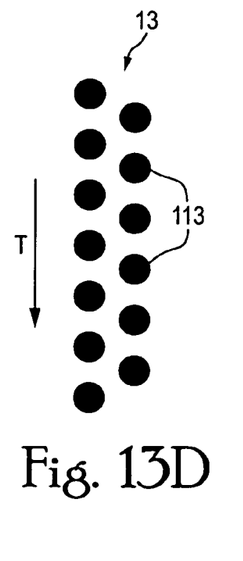
Figure 13E:
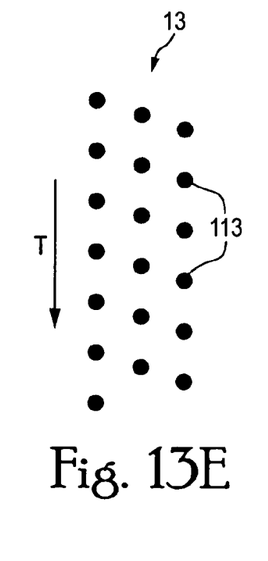

The stability of the droplet chains means that different configurations may be employed, depending upon which functional aspects (recombination and/or debris catching) need to be optimized. FIGS. 13*a-e* show examples of such configurations. FIG. 13*a* depicts a continuous jet 13 in which the recombination surface is moving in the direction T. FIG. 13*b* depicts a stable train of droplets 113, moving in direction T, which for the purposes of this invention may be considered to be a jet 13. The stability of the droplet chains means that these chains may be positioned adjacent to each other to add an extra degree of flexibility when implementing the invention. FIG. 13*c* shows two adjacent chains of droplets 113, effectively creating a jet 13, extended in one direction compared to the jet 13 of FIG. 13*b*. A disadvantage of a droplet chain is that debris has a possible path to pass through the fluid jet. FIG. 13*d* and FIG. 13*e* show how the droplet chains can be shifted in the direction of movement T with respect to each other to effectively create a virtual continuous jet 13 for debris having a trajectory in the plane of the figure and perpendicular to the direction of movement T of the jet.

FIG. 4 in addition shows a further embodiment according to an aspect of the invention, wherein the debris catching shield, herebelow also indicated as a foil trap 15 comprises a static configuration of generally radially oriented platelets 14, relative to the central area 10, wherein the platelets 14 are oriented to shield the electrodes 5 from a line of sight provided between the platelets 14. In this embodiment, at least some of the platelets are of a solid nature, in particular, of foils used in a so called conventional foil trap. It is noted that WO 99/42904 A1 discloses a foil trap of generally the same configuration; however, the publication does not discuss that the platelets 14 are configured to shield the electrodes 5 from a line of sight provided in a predetermined spherical angle relative the optical axis and to provide an aperture to a central area 10 between the electrodes in the line of sight. In comparison with conventional rotating foil traps of the type as disclosed in EP1491963, this static foil trap configuration may have an advantage in easier cooling properties, since, in an embodiment, this static foil trap configuration can be cooled using static coolant circuits devised on or in proximity of the platelets 14. Since the configuration is static, accordingly, cooling may be much simpler and therefore, the configuration can be easily scaled to higher power levels of the source. In addition, this configuration has as a benefit that it does not require moving parts, which may provide constructional advantages since the required strength and dimensions of the platelets 14 may be of a different order than the rotating conventional construction, which requires complex parts such as air bearings and high tension materials that can withstand centrifugal tension forces applied to the platelets. Thus, according to the proposed embodiment, the radially oriented platelets 14 are aiming at the pinch zone 10 thus substantially unhindering transmittance of EUV-radiation 16. This foil trap 15 will fill up with debris at certain locations so a slow rotation around the optical axis (e.g. once a day) could be useful to make sure no debris will contaminate the next foil trap 15 or other optics. This may be useful, since in a preferred embodiment, the optical axis may be 45 degrees with respect to a level plane. This principle could also be designed in combinations of concentric circles and plates. In addition, the geometry of the depicted embodiment, including static radially oriented platelets 14, may have stacking dimensions that have high gas resistance wherein a distance between the platelets may be in an order of 0.5-2 mm, preferably about 1 mm. Accordingly, atomic debris may be trapped easier. Also, a high gas resistance may help to allow a lower buffer gas pressure near the pinch zone 10, which may resulting in a higher efficiency EUV power. Typically, such a buffer gas may be Argon gas.

Figure 10:
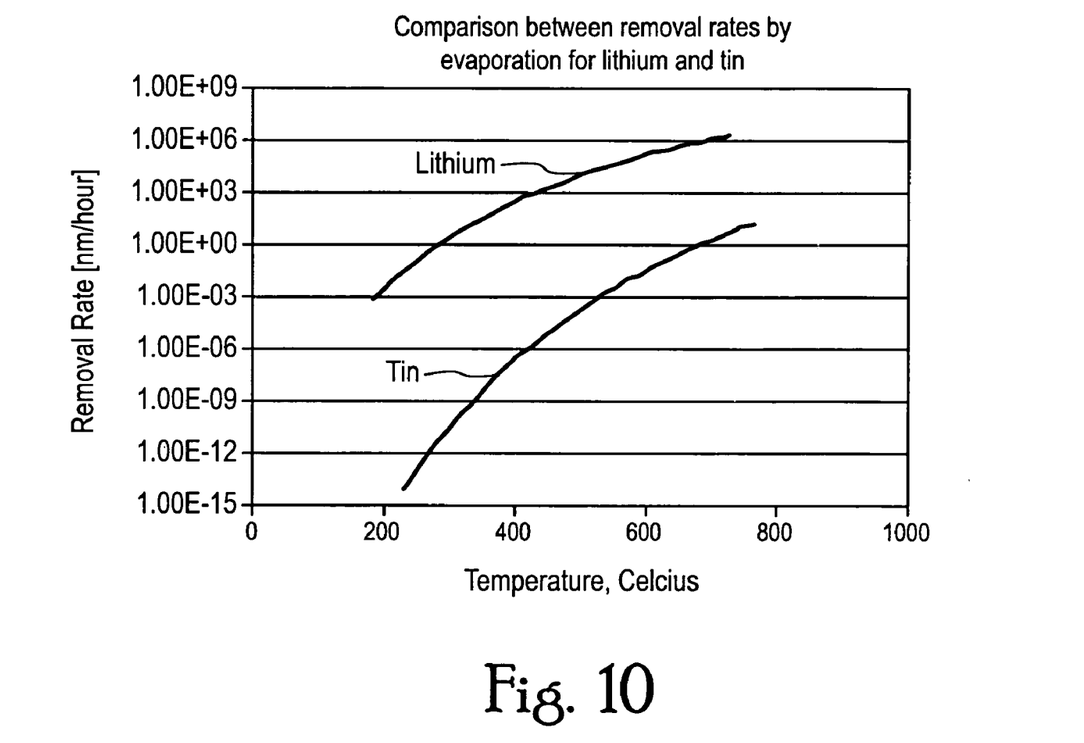
FIG. 10 shows a graph related to a thermal cleaning of the radiation system.
Figure 11:
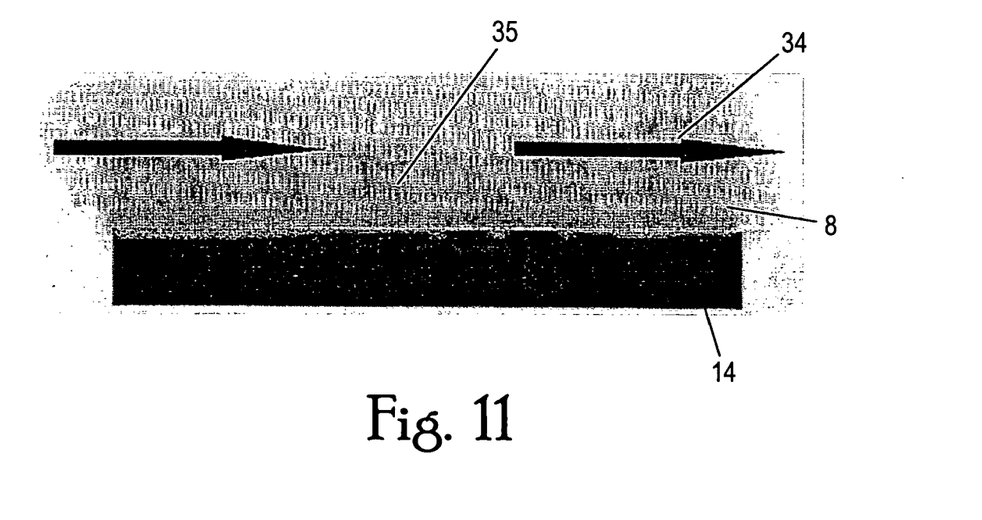
FIG. 11 shows an embodiment of the thermal cleaning principle referred with respect to FIG. 10.
Figure 12:
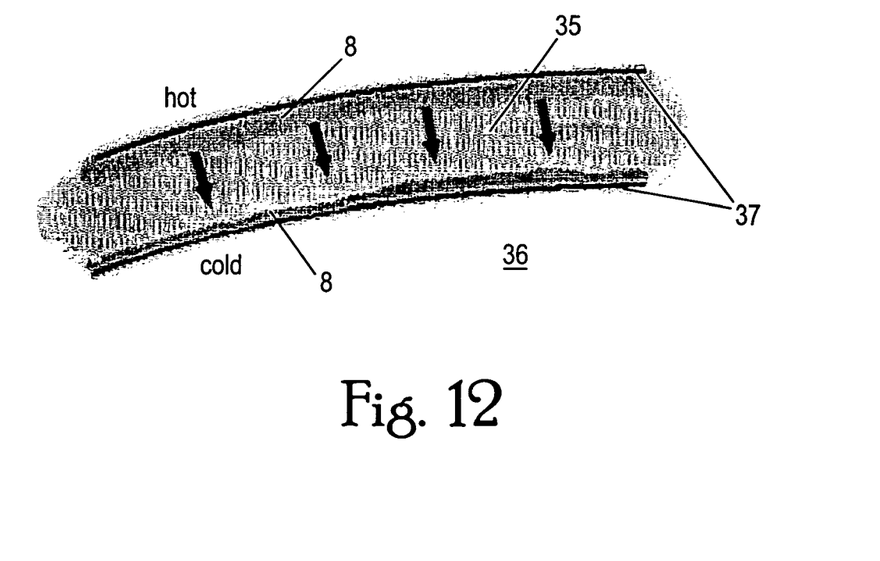
FIG. 12 shows another embodiment of the thermal cleaning principle referred with respect to FIG. 10.

In addition to the thermal cleaning techniques illustrated with reference to the FIG. 10-FIG. 12 presented herebelow, the platelets 14 may provided as a material of porous characteristics for removing the debris from the platelets through capillary action. For instance, by using foil material with porous characteristics (e.g. sintered materials) Tin can be taken out of the optical path and drained (or buffered in an exchangeable element). Accordingly, lifetime of the debris suppression system may be increased and downtime due to foil trap cleaning may be minimized.

In addition to the above-discussed cleaning technique, the radiation system may comprise an excitator 17 (see FIG. 4) for removing the debris from the platelets 14 through mechanical excitation of the platelets 14. For example, by rotating the module fast enough (~2000-3000 RPM as an indication) on a temporarily basis, the tin may be spun of the relevant foils, and may be caught by a getter 18. In an embodiment, the revolution axis is the optical axis, but other axes of revolution may also be possible. A combination of rotation and vibration is also an option. Accordingly, the excitator may comprise a centrifuge for removing the debris from the platelets through centrifugal action and advantageously a getter 18 for catching debris 8 removed from the platelets.

Also, the foil could be externally excited (longitudinal waves) so a flow of tin in a predefined direction may be present. Also (directional) accelerations/vibrations can be used to give excitation profile(s) (pending between stick/slip effect of the droplets) to the entire module instead of each separate foil.

Figure 5:
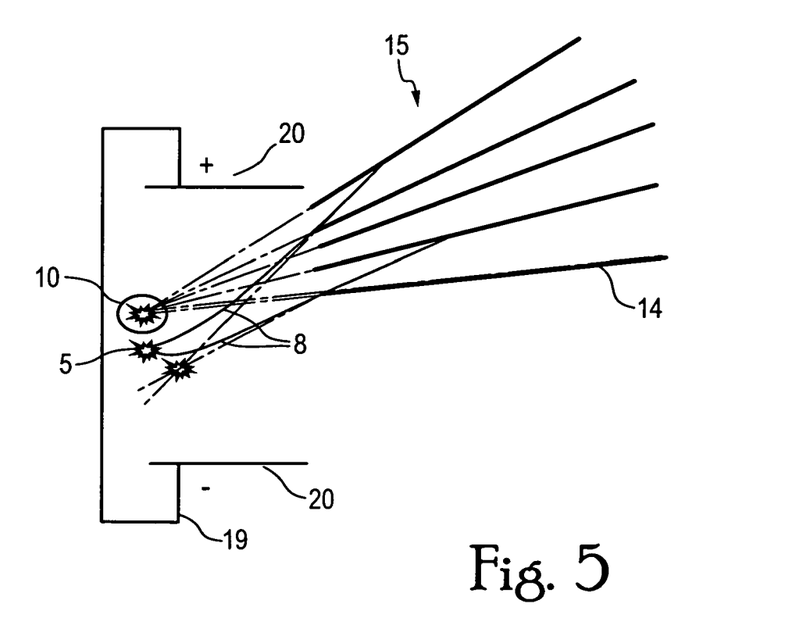
FIG. 5 shows a modification of the arrangement described with reference to FIG. 4.

FIG. 5 discloses a further embodiment of the arrangement described with reference to FIG. 4. In this embodiment, a deflecting electromagnetic field unit 19 is disposed between the electrodes 5 and a shield, in this embodiment illustrated as foil trap 15. By applying an electromagnetic field, charged debris particles 8 traveling from the debris producing zones 9 can be deflected, which accordingly can be used to virtually expand the distance between the EUV radiation producing pinch zone 10 and the debris producing zones 9 as will be made even more clear with reference to FIG. 7. In FIG. 5, the deflecting field is produced by a pair of electrodes 20 arranged oppositely to the optical axis. Accordingly, a static electric field is generated according to which the electrically charged particles can be deflected.

Figure 6:
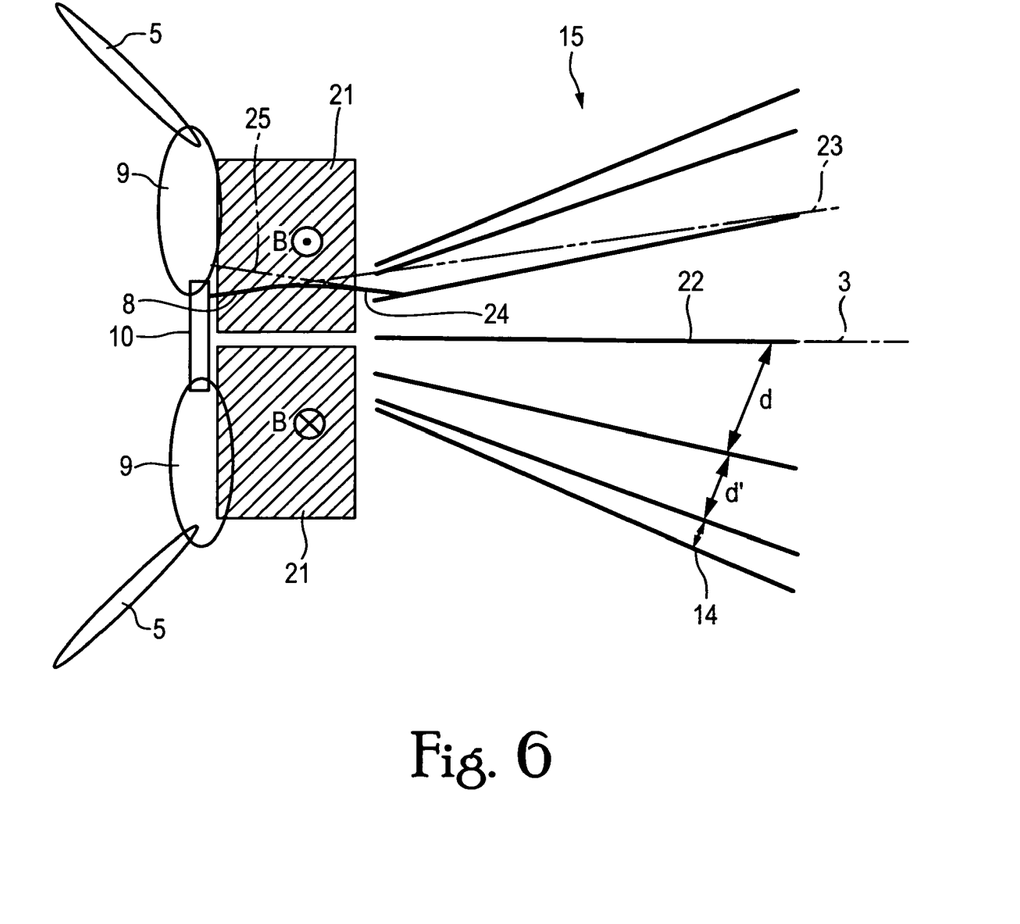
FIG. 6 shows an alternative modification of the arrangement described with reference to FIG. 4.

In FIG. 6, in contrast to the embodiment depicted in FIG. 5, or in addition to it, the electromagnetic deflecting field is provided as a static magnetic field 21, due to magnet elements 26 (see FIG. 8) arranged around the optic axis 3. For a front view of this configuration, see FIG. 8. Although various static field configurations are feasible, an optimally defined field is provided as a quadrupole field, arranged for deflecting substantially all electrically charged particles 8 traveling generally in a direction towards the optical system (not shown), towards a plane 22 oriented along the radially oriented platelets 14 and generally parallel to a length axis of the electrodes 5. Preferably, as is also shown in the Figure, this plane 22 is provided along the optical axis 3. However, it may be possible to select another region that is more off axis to deflect the particles thereto. Accordingly, charged debris particles can be deflected more easily towards the platelets 14 of the foil trap 15, which virtually increases the distance between the electrodes 5. Consequently, fewer platelets 14 may be needed to achieve a given extent of debris suppression. Accordingly, a typical distance may range between 0.5 and 3 mm, preferably about 2 mm. This significantly increases the optical transmission of the foil trap.

The principle of operation in FIG. 6 is as follows. The rectangle 10 indicates an acceptance width of the foil trap in the absence of a magnetic field and is accordingly generally corresponding to a zone 10 from where EUV radiation is produced. However, particles 8 generated near the edges of the zone 10 (accordingly, produced from a debris producing zone 9) may travel unhindered through the shield, in this embodiment illustrated as foil trap 15, without being intercepted, as illustrated by the trajectory 23.

By applying a magnetic field of the type as indicated (with a conventional arrow indication), such debris particles 8 are deflected towards the optical axis 3. For example, the particle with trajectory 23 may be deflected to follow the solid line 24 and no longer be transmitted through the foil trap 15. This is because on entrance of the foil trap, the particle appears to originate from a point outside the acceptance width 10 as indicated by the other dashed line 25. In other words, the application of the magnetic field effectively narrows down an effective acceptance width of the shield, which width defines a zone from where debris particles could enter the system unhindered. Accordingly, for a given dimensioning of the acceptance width, the optical transmission may be improved by reducing the number of platelets 11 and applying a magnetic field.

A typical distance for the acceptance width of the foil trap in the absence of a magnetic field may be ranging from about 0.5 to about 2 mm, preferably about 1 mm. For typical foil trap dimensions (inner radius 30 mm, relative to a central zone 10, outer radius 139 mm), this leads to a foil trap with 137 foils having an optical transmission of approximately 63%. As the Figure shows, in a preferred embodiment, the distance d, d' between the platelets 14 may vary, wherein typically a distance d towards the optical axis 3 may increase relative to distances d' away from the optical axis 3.

Figure 7:
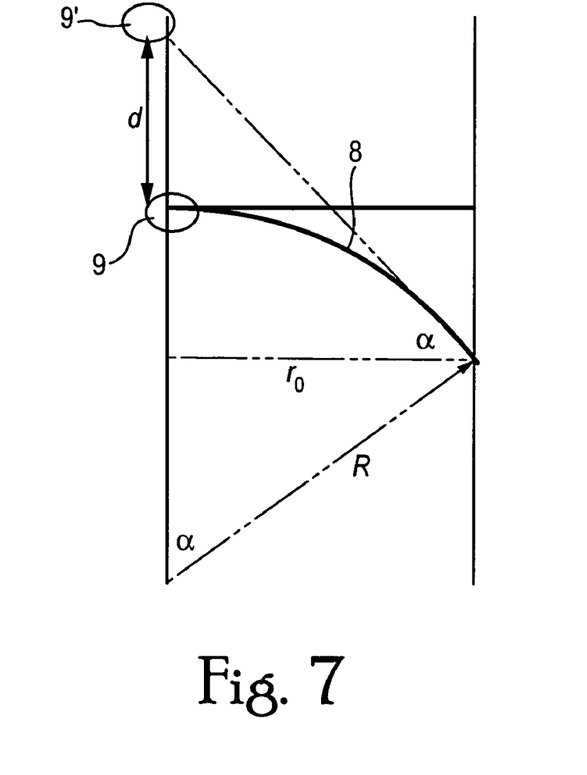
FIG. 7 schematically shows a deflection principle of debris from the EUV source.

FIG. 7 shows how the source of the particles, that is, the debris producing zone 9 can be virtually shifted over a distance d to a virtual debris producing zone 9' by applying the magnetic field. Accordingly, an effective acceptance width may be reduced.

In the presence of a magnetic field B, a particle with charge q and velocity v experiences a Lorentz force given by $$F = qv \times B \qquad (1)$$

Consequently, if the direction of the magnetic field is perpendicular to the velocity, the particle follows a circular trajectory with radius R equal to $$R = \frac{mv}{qB} \qquad (2)$$

In the present embodiment, the angular deflection α due to the magnetic field depends on the distance over which the field is applied, which is approximately equal to the inner radius of the foil trap $r_0$. The deflection angle is given by $\sin \alpha = r_0/R$ as shown in FIG. 3. The apparent point of departure of the particle is accordingly displaced over a distance d given by $$d = r_0 \sin \alpha - R(1 - \cos \alpha) \qquad (3)$$

which for small values of α reduces to $$d = \frac{r_0^2}{2R} \quad (4)$$

By substituting Eq. (2), the following expression relating the displacement d to the characteristic parameters q, m and v of the debris particles is obtained:

$$d = \frac{qBr_0^2}{2mv} \quad (5)$$

Using permanent magnets or electromagnets, a magnetic field of the order of 1 T can fairly easily be achieved. When a magnetic field is applied so that the displacement d is equal to 0.5 mm for a certain type of debris, the acceptance width for that debris accordingly effectively decreases by a factor of 2 compared to the earlier mentioned value of 1 mm acceptance width. One can therefore construct a foil trap that has an acceptance width of 2 mm and still obtain the same extent of debris mitigation. Such a foil trap may have only 69 foils and an optical transmission of 70%. Thus, the optical transmission is significantly improved by applying a magnetic field.

Figure 8:
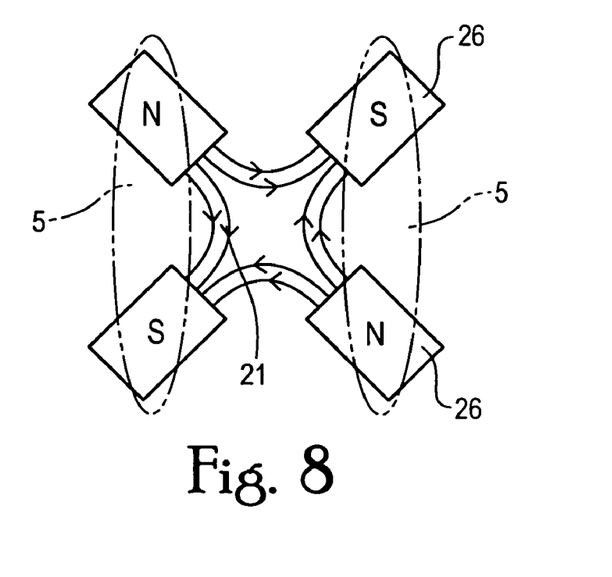
FIG. 8 schematically shows a quadrupole magnet arrangement for providing debris deflection.

FIG. 8 shows a front view, seen along the optic axis, of the electrodes 5 and a quadrupole magnet configuration of magnets 26. In this configuration, the North-South lines of opposing magnets 26 are oriented alternating and generally parallel to the longitudinal axis of the electrodes 5. Accordingly, a magnetic field may be produced that follows the orientation depicted in FIG. 6, that is, with a general direction of the magnetic field on either sides of the optic axis 3 in a plane generally parallel to the length axis of the electrodes, to deflect the particles inwards towards a plane 22 coaxial with the optic axis 3. Accordingly, for typical configurations, positively charged particles are focused to a vertical plane (by focusing in the horizontal direction and spreading in the vertical direction). Alternatively, a similar (but less well-defined) deflecting field may be obtained by placing two identical magnetic poles on opposite sides of the optical axis.

Figure 9A:
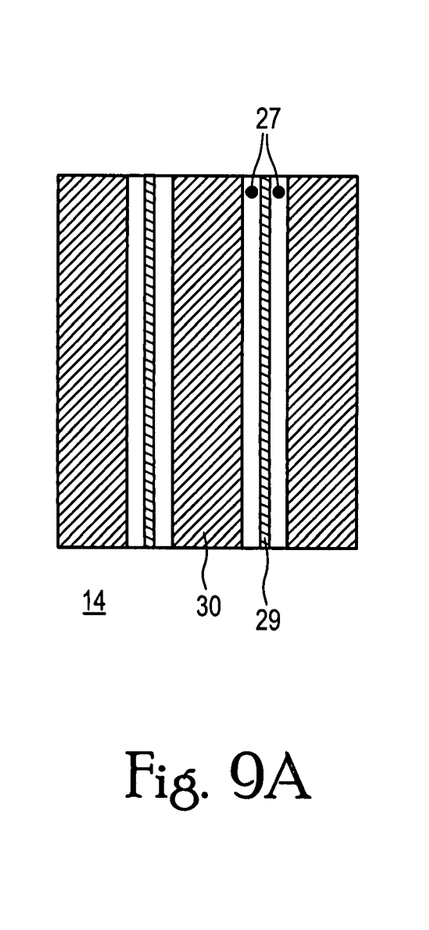
FIGS. 9a-c illustrate a further embodiment of the arrangement of FIG. 4.
Figure 9B:
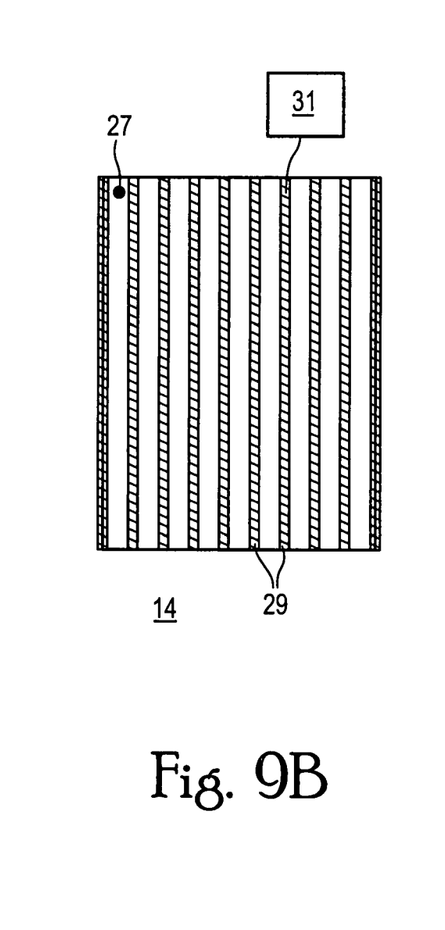
Figure 9C:
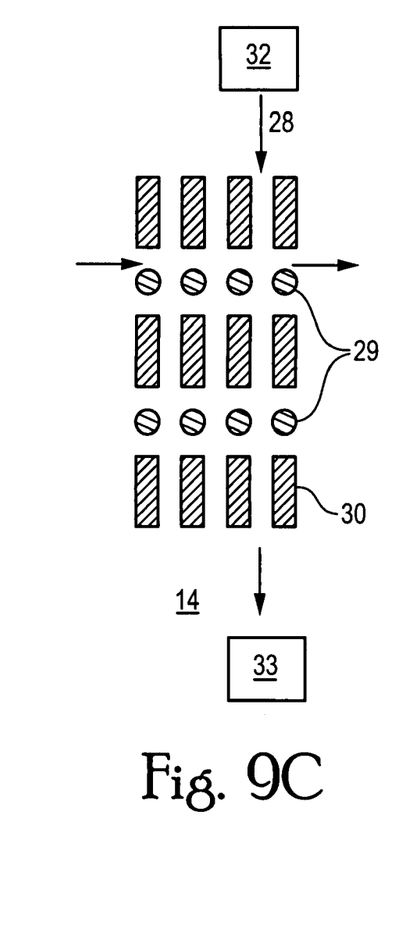

FIG. 9 shows a further embodiment of the static configuration of generally radially oriented platelets 14 described with reference to FIG. 4. In this embodiment, instead of solid monolithic platelets 14, in at least some of the platelets 14, traverses 27 are provided oriented generally transverse to the platelets 14. This embodiment may provide thermal isolation to the further downstream platelets 14, as seen from the EUV source 4. In addition to it, possibly by applying fluid jets as shown in FIG. 3, preferably on a proximal side of the platelets 14 relative to the EUV source 4, the heat load to the platelets 14 can be further managed. In addition, a gas 28 can be guided through the traverses 27 of the platelets 14, which may be used for cleaning purposes of the platelets 14, for example, a hydrogen radical gas. Accordingly, the platelets 14 can be cleaned to prevent debris depositing on the platelets 14, thereby preventing a situation in which EUV light will no longer be able to pass through the platelets. Preferably, the foil trap may be cleaned without having to take the foil trap out of the system. The principle of additional traverses in the shown foil trap embodiment could also be used for other types of foil traps, in particular, in non-static foil traps.

In addition to, or alternatively, the traverses may be used as a buffer gas to provide a buffer gas zone within a zone in side the platelets, in order to be able to further trap, for example, neutral nanoparticles which may diffuse through the platelets 14 and may cause contamination of the optical system provided downstream (not shown). FIG. 9A shows a side view of an embodiment with traverses 27, which may be provided with alternating use of wires 29 and platelet parts 30.

FIG. 9B shows an embodiment with only wires 29; to provide a configuration similar to the fluid jet configuration depicted in FIG. 3. FIG. 9C in addition shows a top view generally seen along an axis parallel to the length axis of the electrodes 5, of the platelet embodiment depicted in FIG. 9A. The more open structure of FIG. 9B has an advantage when integrating foil trap cleaning based on hydrogen radicals, because it becomes easier to bring the reactive H radicals to the surface of the foils, and it becomes easier to transport the reaction products out of the foil trap 15. However, the drawback is that the flow resistance of the foil trap 15 becomes lower, which may make it more difficult to achieve a high buffer gas pressure. Therefore one needs to optimize the amount of openings in the platelets. The preferred embodiment therefore is in most cases a partially open foil structure, as shown in FIG. 9A. Furthermore, in a preferred embodiment H cleaning is integrated with the wired structures shown in the figures by providing an electric current supply 31, which is connected to at least some of the wires 29 of a platelet 14. At least some of the wires 29 in the platelet are now interconnected in order to allow a current to run through several wires 29 simultaneously. With a high enough current (for example, 20 A for a 0.4 mm thick wire), the wires will form a filament that will reach temperatures of about 2000 0C where typically H2 molecules will dissociate, generating H radicals. These H radicals can then react with Sn to form gaseous SnH4, which is pumped out of the system. In order to add H2 to the system, the embodiment therefore further comprises a H2 gas inlet 32 and the embodiment comprises a vacuum pump 33 to remove gas from the system (as shown in FIG. 9C).

Alternatively, it is possible to remove debris from the capture shield using evaporation. FIG. 10 shows a graph of a calculation that was performed to calculate the removal rate of tin and lithium, for temperatures in a range of 200-800° C. In addition, for tin a removal rate of about 0.1 nm/hour was calculated for a temperature of about 900 K, and a rate of about 1 E5 nm/hour for a temperature of about 1400 K, with an almost exponential increase. Thus, in a range between these temperature values, by providing a heating system (which may be EUV source 4) the debris catching shield, in particular a foil trap 15 of the kind as shown in FIG. 4 may be selectively heated to elevate a temperature of the debris shield to a temperature for evaporating debris from the debris catching shield. In addition a gas supply system is provided which may in use serve for providing a buffer gas flow between the platelets, and which may off line be used for cleaning purposes, in particular, for providing a gas flow to evacuate evaporated debris from the debris catching shield. A particular preferable elevation temperature of the debris catching shield for a tin plasma source may be at least 900 K for offline cleaning purposes. Accordingly an alternative may be provided for chemically reactive cleaning, which may be harmful to the optics system. For a temperature of the platelets 14 of 940 K (667 C) a Tin evaporation of 0.4 nm/hour may be achievable.

Advantageously, a lithium plasma source is used since lithium has a significantly higher vapor pressure than tin (about 9 orders of magnitude) and as a consequence also a significantly higher removal rate (removal rate of 0.4 nm/hr requires temperature of only 550 K (277 C). This allows applying evaporative cleaning of lithium-contaminated surfaces at significantly lower temperatures than evaporative cleaning of tin-contaminated surfaces; evaporative cleaning of collector shells contaminated with lithium is feasible.

FIG. 11 shows a general schematic illustration of the cleaning principle explained hereabove with reference to FIG. 10. In particular, a platelet 14 is heated, so that debris 8 deposited thereon will be evaporated. By providing a gas flow 34 along the platelet 14, the evaporated debris, for example, tin vapor 35, will be carried away from the platelet, through which the platelet can be cleaned. Although FIG. 11 has been explained with reference to a gas flow along a platelet 14 of a foil trap, the cleaning principle can be used generally, to clean EUV mirror surfaces in particular, of downstream optical elements such as a collector element.

In FIG. 11, the object to be cleaned (a platelet 14 or mirror optic) is heated while a gas is flowing over the mirror in order to transport the tin vapor away from the mirror. Heating can be done with a heating device, but it is also possible to temporarily reduce active cooling of the object, and use the heat generated by the EUV source.

In FIG. 12 this technique is used for the collector 36 of an EUV lithography setup. In this embodiment the collector shells are heated one-by-one, in order to evaporate the tin from the reflective side of the collector shell, and to deposit the tin vapor on the backside of the collector shell below. When a collector shell 37 is heated, it will typically evaporate tin on both sides of the shells. This means that also the backside of the shell will evaporate tin and deposit this on the reflective surface of the collector shell above. To prevent this it is preferable to heat the center shell first, and then continue with the next shell, etc. Thus by cleaning the collector shells in the right order and controlling the temperature of the collector shell at the same time, it is possible to minimize (re) deposition on the reflective surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

What is claimed is:

1. A radiation system for generating a beam of radiation defining an optical axis, the radiation system comprising:
   a plasma produced discharge source constructed and arranged to generate extreme ultraviolet radiation, the discharge source comprising a pair of electrodes constructed and arranged to be provided with a voltage difference, and a system constructed and arranged to produce a discharge between said pair of electrodes so as to provide a pinch plasma between said electrodes; and
   a debris catching shield constructed and arranged to catch debris produced on or near said electrodes in debris producing zones, to shield said electrodes from a line of sight provided in a predetermined spherical angle relative the optical axis, and to provide an aperture to a central area between said electrodes in said line of sight.

2. A radiation system according to claim 1, wherein the debris catching shield comprises at least one fluid jet.

3. A radiation system according to claim 2, wherein the fluid jet comprises molten tin or a tin compound.

4. A radiation system according to claim 3, wherein the tin compound comprises Ga—In—Sn.

5. A radiation system according to claim 1, wherein the debris catching shield is provided by a pair of fluid jets, arranged oppositely and generally parallel to a longitudinal axis of the electrodes.

6. A radiation system according to claim 2, wherein the debris catching shield comprises a plurality of fluid jets, arranged in radial direction relative from the central area.

7. A radiation system according to claim 6, wherein said plurality of fluid jets are provided adjacent to each other.

8. A radiation system according to claim 1, wherein the debris catching shield is provided at a distance from the electrodes ranging between about 0.5 mm and about 25 mm.

9. A radiation system according to claim 1, wherein the debris catching shield is provided by a moving element that moves generally parallel to an electrode longitudinal axis.

10. A radiation system according to claim 9, wherein a container is provided for containing a coolant, for guiding said moving element therethrough.

11. A radiation system according to claim 1, wherein the debris catching shield comprises a static configuration of generally radially oriented platelets, relative to said central area, wherein the platelets are oriented to shield the electrodes from a line of sight provided between said platelets.

12. A radiation system according to claim 11, wherein a distance between the platelets is increased relative to distances away from the optical axis.

13. A radiation system according to claim 11, wherein a distance between the platelets ranges between about 0.5 mm and about 3 mm.

14. A radiation system according to claim 11, further comprising an electromagnetic deflecting field unit disposed for applying an electromagnetic deflecting field between the electrodes and the shield.

15. A radiation system according to claim 14, wherein said electromagnetic deflecting field unit provides a static magnetic field.

16. A radiation system according to claim 15, wherein said magnetic field is provided as a quadrupole field, arranged for deflecting positive particles towards a plane oriented along said radially oriented platelets.

17. A radiation system according to claim 16, wherein said plane is provided along the optic axis.

18. A radiation system according to claim 11, further comprising a hydrogen radical supply system for guiding hydrogen radicals through said platelets.

19. A radiation system according to claim 11, wherein at least some of the platelets are provided with traverses oriented generally transverse to said platelets.

20. A radiation system according to claim 19, further wherein said traverses are provided with wires.

21. A radiation system according to claim 19 further comprising a hydrogen radical supply system for guiding hydrogen radicals through said traverses.

22. A radiation system according to claim 11 wherein at least some of the platelets are provided by a fluid jet.

23. A radiation system according to claim 22, wherein the fluid jet comprises molten tin or a tin compound.

24. A radiation system according to claim 23, wherein the tin compound comprises Ga—In—Sn.

25. A radiation system according to claim 1, further comprising a heating system that can be selectively heated for elevating a temperature of said debris catching shield to a temperature for evaporating said debris from said debris catching shield; and a gas supply system for providing a gas flow to evacuate said evaporated debris from said debris catching shield.

26. A radiation source according to claim 25, wherein said elevation temperature is at least 900° C. to remove tin debris.

27. A radiation source according to claim 25, wherein said elevation temperature is at least 270° C. to remove lithium debris.

28. A radiation system according to claim 1, wherein said plasma source comprises tin, lithium, or xenon.

29. A radiation system according to claim 11, wherein the platelets are provided as a material of porous characteristics for removing said debris from said platelets through capillary action.

30. A radiation system according to claim 11, further comprising an excitator for removing said debris from said platelets through mechanical excitation of said platelets.

31. A radiation system according to claim 30, wherein said excitator comprises a vibrator for providing vibrations to said platelets.

32. A radiation system according to claim 30, wherein said excitator comprises a centrifuge for removing said debris from said platelets through centrifugal action.

33. A radiation system according to claim 30, further comprising a getter for catching debris removed from said platelets.

34. A radiation system according to claim 1, wherein the system that is constructed and arranged to produce a discharge between said pair of electrodes comprises a laser.

35. A lithographic apparatus comprising:
  a radiation system constructed and arranged to generate a beam of radiation defining an optical axis, the radiation system comprising:
    a plasma produced discharge source constructed and arranged to generate extreme ultraviolet radiation, the discharge source comprising a pair of electrodes constructed and arranged to be provided with a voltage difference, and a system constructed and arranged to produce a discharge between said pair of electrodes so as to provide a pinch plasma between said electrodes; and
    a debris catching shield constructed and arranged to catch debris produced on or near said electrodes in debris producing zones, to shield said electrodes from a line of sight provided in a predetermined spherical angle relative the optical axis, and to provide an aperture to a central area between said electrodes in said line of sight;
  a patterning device constructed and arranged to pattern the beam of radiation; and
  a projection system constructed and arranged to project the patterned beam of radiation onto a substrate.

* * * * *